United States Patent
Tomoda (10) Patent No.: US 6,463,576 B1
(45) Date of Patent: Oct. 8, 2002

(54) METHOD FOR DESIGNING AN ASIC AND ASIC DESIGNING APPARATUS

(75) Inventor: Yoshiyuki Tomoda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/531,717

(22) Filed: Mar. 21, 2000

(30) Foreign Application Priority Data

Mar. 24, 1999 (JP) .......... 11-079023

(51) Int. Cl.$^7$ .......... G06F 17/50; H03K 19/00
(52) U.S. Cl. .......... 716/17; 716/11; 716/13; 716/15; 716/17; 716/18
(58) Field of Search .......... 716/17–18, 14–15, 716/11, 13

(56) References Cited

U.S. PATENT DOCUMENTS

| | | | | |
|---|---|---|---|---|
| 5,384,710 A | * | 1/1995 | Lam et al. .......... | 364/489 |
| 5,493,508 A | * | 2/1996 | Dangelo et al. .......... | 364/489 |
| 5,838,947 A | * | 11/1998 | Sarin .......... | 395/500 |
| 5,867,400 A | * | 2/1999 | El-Ghoruury et al. .......... | 364/490 |
| 5,910,897 A | * | 6/1999 | Dangelo et al. .......... | 364/488 |
| 5,933,356 A | * | 8/1999 | Rostoker et al. .......... | 364/489 |
| 6,216,252 B1 | * | 4/2001 | Dangelo et al. .......... | 716/1 |

FOREIGN PATENT DOCUMENTS

| | | |
|---|---|---|
| JP | H07-045707 | 2/1995 |
| JP | 8-1948 | 1/1996 |
| JP | H09-034927 | 2/1997 |
| JP | 2752923 | 2/1998 |
| JP | 10-340959 | 12/1998 |

* cited by examiner

Primary Examiner—Vuthe Siek
Assistant Examiner—Granvill D. Lee, Jr.
(74) Attorney, Agent, or Firm—Scully, Scott, Murphy & Presser (57) ABSTRACT

A method for designing an ASIC has a first step of generating circuit data that includes a large-scale hardware macro made up of primitive macros; a second step of extracting, from the circuit data generated in the first step, wiring data of an external terminal of the large-scale hardware macro, an output of which is in an open state or an input of which is clamped; a third step of performing circuit tracing using the wiring data of the external terminal extracted in the second step; a fourth step of removing wiring data of a redundant primitive macro and redundant wiring data connected to said redundant primitive macros using the wiring data of the external terminal extracted in the second step; a fifth step of generating a temporary library in which a delay time within the macro is adjusted, based on removal results obtained in the fourth step; and a sixth step of performing layout and wiring, and of performing a delay simulation, using the temporary library generated in the fifth step.

6 Claims, 9 Drawing Sheets

1, 2, 3, 4, 5 ··· PRIMITIVE MACRO

Fig. 5

1, 2, 3, 4, 5 ⋯ PRIMITIVE MACRO

Fig. 8

PRIOR ART

Fig. 9
PRIOR ART

METHOD FOR DESIGNING AN ASIC AND ASIC DESIGNING APPARATUS

BACKGROUND OF THE INVENTION

1. Field of the Invention

The present invention relates to a technique for designing a large-scale hardware macro for an ASIC (Application Specific Integrated Circuit), and more particularly it relates to an ASIC design method and ASIC designing apparatus which eliminate redundant interconnections and increases the interconnect region usable for user logic when a large-scale macro is implemented on an ASIC.

2. Background of the Invention

Figure 8:
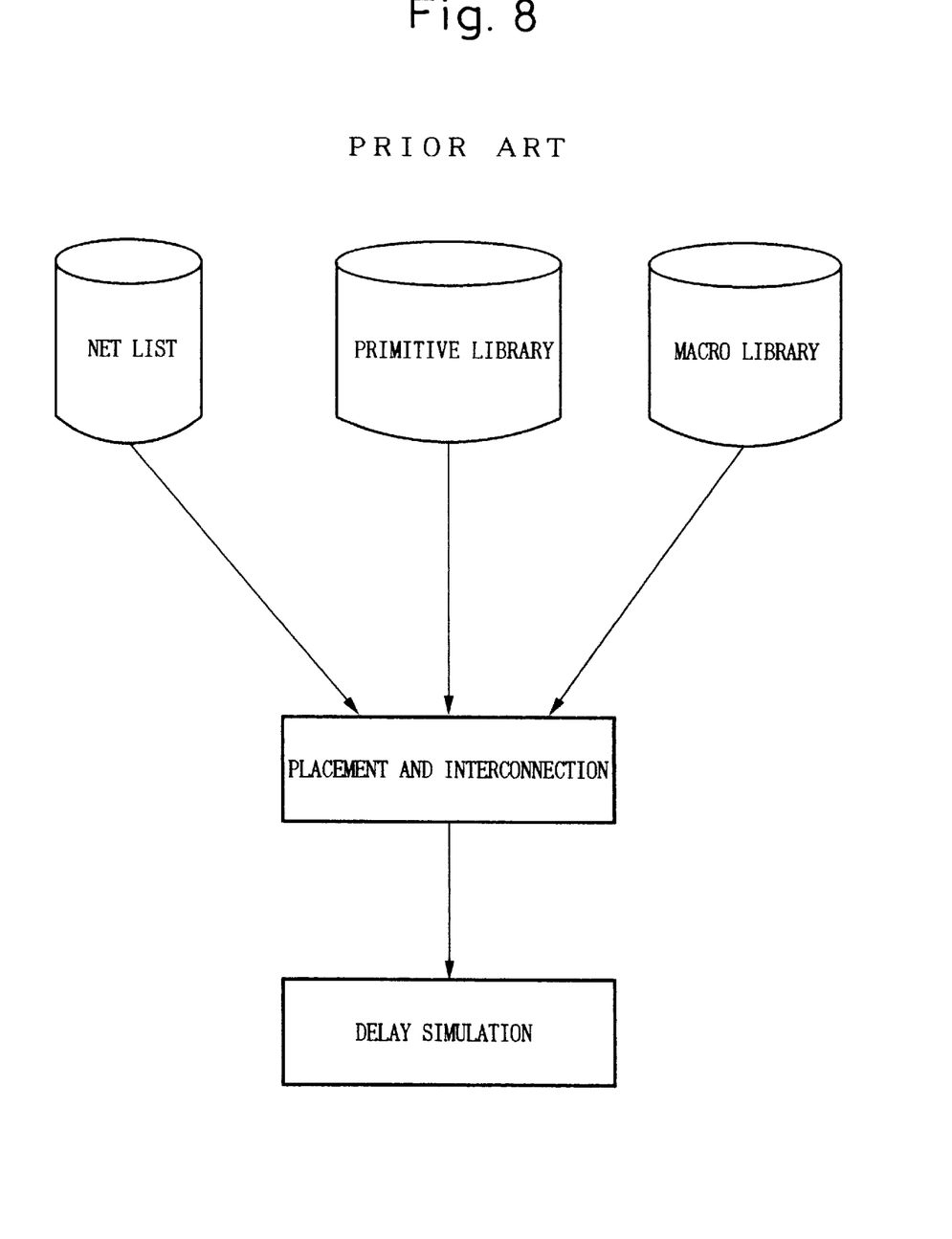
FIG. 8 is a drawing showing the flowchart, illustrating an ASIC design method according to the prior art.
Figure 9:
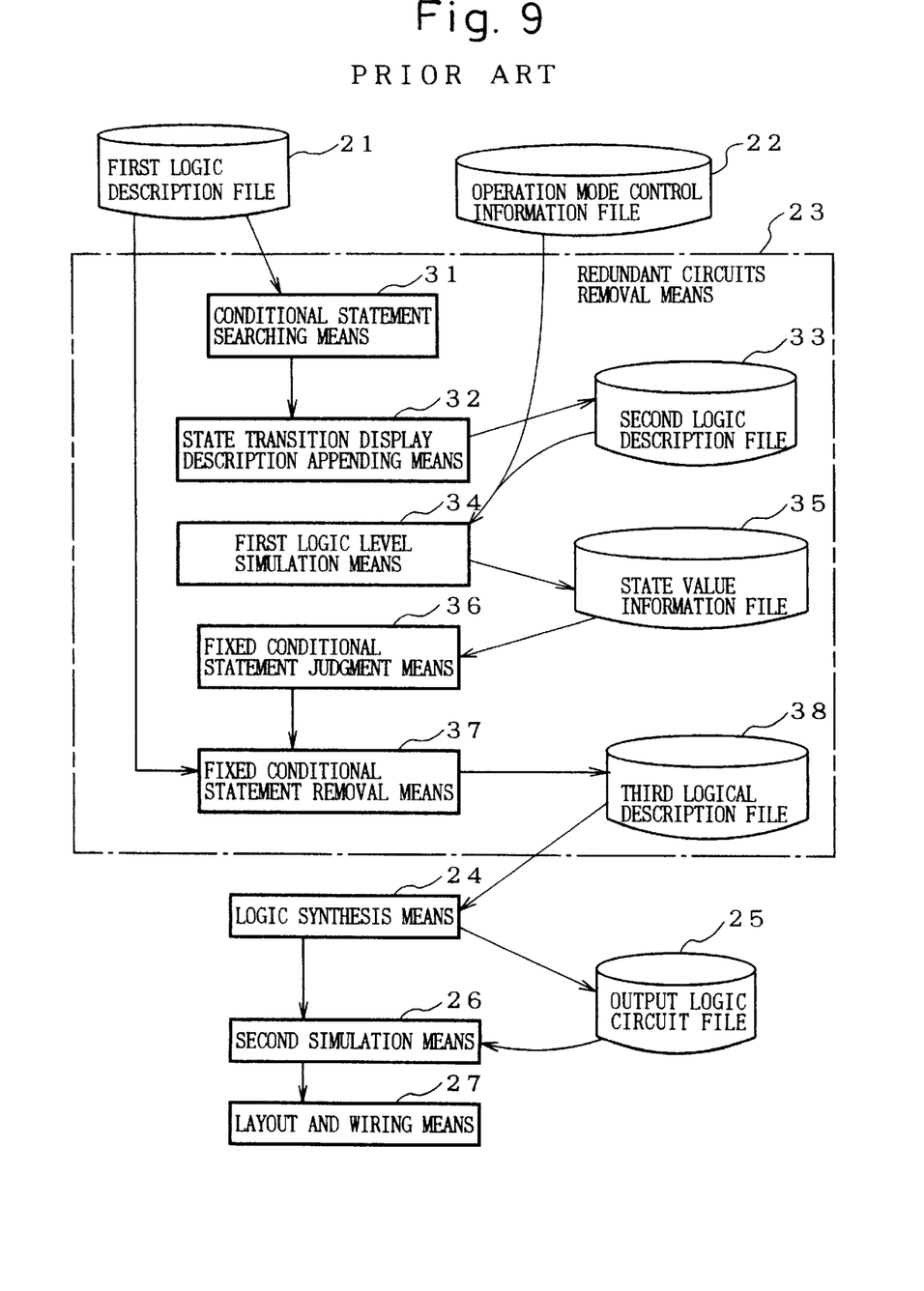
FIG. 9 is a drawing showing the another flow chart, illustrating an ASIC design method according to the prior art.

FIG. 8 shows a flow chart that illustrates a method of designing an ASIC according to the prior art. In the ASIC design method of the prior art shown in FIG. 8, a primitive library, micro library, and net list are used to perform layout and wiring, without eliminating redundant circuits from the macro, after which a delay simulation is performed. In the past, to implement a circuit having a large-scale hardware macro made up of primitive macros, either layout and wiring were made without eliminating redundant circuits, or a macro of the desired specifications was designed anew. Because the specifications of the actual macro differ from customer to customer, the result is that general-purpose macros include different redundant portions for individual customers. To optimize this, a macro is developed anew for the customer specifications, in which case the term required to develop a new macro is approximately 3 months, thereby greatly increasing the time and cost required for development. In the case in which an existing macro is used as is, because interconnection data including redundant circuits have priority for customers, there is a worsening of the interconnections in the customer's designed circuit. For example, in the case in which only a DMA controller with a 16-it data bus is available in the macro library, a macro having a 16-it data bus will be used, even though only an 8-bit data bus is used, the remaining buses that are not needed in the chip become redundant circuits. The result of this is a worsening of interconnections of the user logic. In the Japanese Patent 2,752,923, for example, there is a description for eliminating such redundancies. Specifically, according to the prior art of Japanese Patent 2,752,923 as shown in FIG. 9, in a logic simulation apparatus having a redundant circuits removal means 23 which, based on first logic descriptive information 21 and operation mode control information 22 for the circuit to be designed, generates third logical descriptive information 38 by performing logic simulation and removing from the first logic descriptive information 21 redundant circuits that are not needed in the circuit to be designed, a logic synthesis means 24 for performing logic synthesis based on the third logic descriptive information 38 so as to generate a gate-level output logic circuit 25, and a second logic simulation means 26 for evaluating the output logic circuit 25, the redundant circuits removal means 23 of this logic simulation apparatus further has a conditional statement searching means 31 for searching for a conditional statement indicating an input-to-output condition from among the first logic descriptive information 21, a state transition display description appending means 32 which, based on the retrieved conditional statement, generates second logic descriptive information 33 with state transition information added by the means 32, a first logic simulation means 34 which receives the operating mode control information 22 and the second logic descriptive information 33, performs a logic simulation, and outputs state value information 35, which is the result of the simulation, a fixed conditional statement judgment means 36 which, based on state value information 35, judges and extracts a fixed conditional statement corresponding to a redundant circuits, and a fixed conditional statement removal means 37 which, based on the results of the judgment, removes a fixed conditional statement from the first logic descriptive information 21, so as to generate a third logic description file 38. By this configuration, a condition statement is searched in the input macro logic description file 21 and, by means of the results of simulation of logic description file to which a state transition display statement has been added, it is possible to make a judgment on a fixed condition and to remove this fixed condition from the original logic code so as to remove a redundant portions from the circuit, thereby enabling automatic removal of redundant portions from the circuit, shortening the design turnaround time, and also reducing the number of elements in the integrated circuit, which reduces the area of the circuit, the result of which is a reduction in cost.

In the prior art, however, while there is a large degree of freedom in removal at the function description level, it is necessary to perform evaluation of layout, wiring and delay times many times, this being a problem in the design of an ASIC for a particular customer.

Accordingly, in consideration of the above-noted drawback of the prior art, it is an object of the present invention to provide an ASIC design method and ASIC design apparatus which removes redundant interconnections when implementing a large-scale hardware macro in an ASIC, and which increase the interconnect region usable by user logic.

SUMMARY OF THE INVENTION

In order to achieve the above-noted objects, the first aspect of the present invention has the following basic technical constitution.

Specifically, a first aspect of the present invention is a method for designing an ASIC having a first step of generating circuit data that includes a large-scale hardware macro made up of primitive macros; a second step of extracting, from the circuit data generated in the first step, wiring data of an external terminal of the large-scale hardware macro, an output of which is in an open state or an input of which is clamped; a third step of performing circuit tracing using the wiring data of the external terminal extracted in the second step; a fourth step of removing wiring data of a redundant primitive macro and redundant wiring data connected to said redundant primitive macros using the wiring data of the external terminal extracted in the second step; a fifth step of generating a temporary library in which a delay time within the macro is adjusted, based on removal results obtained in the fourth step; and a sixth step of performing layout and wiring, and of performing a delay simulation, using the temporary library generated in the fifth step.

In a second aspect of the present invention, the fourth step includes a step of prohibiting a removal of wiring data of a clock line in a flip-flop circuit.

In a third aspect of the present invention, the fourth step includes a step of prohibiting a removal of wiring data having a branch circuit in a net list, when the wiring data of the external terminal extracted in the second step includes a branch circuit.

In a fourth aspect of the present invention, the fourth step includes a step of setting removal prohibition information within the library, so as to impart a limitation on the removal of wiring data of redundant primitive macros and redundant wiring data connected to the redundant primitive macros.

A fifth aspect of the present invention is an apparatus for designing an ASIC comprising a first means of generating circuit data that includes a large-scale hardware macro made up of primitive macros; a second means of extracting, from the circuit data generated in the first means, wiring data of an external terminal of the large-scale hardware macro, an output of which is in an open state or an input of which is clamped; a third means of performing circuit tracing using the wiring data of the external terminal extracted in the second means; a fourth means of removing wiring data of a redundant primitive macro and redundant wiring data connected to said redundant primitive macros using the wiring data of the external terminal extracted in the second means; a fifth means of generating a temporary library in which a delay time within said macro is adjusted, based on an output of said fourth means; and a sixth means of performing layout and wiring, and of performing a delay simulation, using the temporary library generated in the fifth means.

In a sixth aspect of the present invention, the fourth means includes a means of prohibiting a removal of wiring data of a clock line in a flip-flop circuit.

In a seventh aspect of the present invention, the fourth means includes a means of prohibiting a removal of wiring data having a branch circuit in a net list, when the wiring data of the external terminal extracted in the second means includes a branch circuit.

In an eighth aspect of the present invention, the fourth means includes a means of setting removal prohibition information within the library, so as to impart a limitation on the removal of wiring data of a redundant primitive macro and redundant wiring data connected to the redundant primitive macros.

DESCRIPTION OF THE PREFERRED EMBODIMENTS

Embodiments of the present invention are described in detail below, with reference made to relevant accompanying drawings.

The embodiments of the present invention described below relate to a method of designing a CPU peripheral circuit such as a DMA controller, an interrupt controller or a large-scale hardware macro such as a multiplier, which is implemented in an ASIC by using primitive macros, and more particularly they relate to a method for designing an ASIC, whereby when a large-scale hardware macro is implemented in an ASIC redundant interconnection circuits are removed and the interconnect region usable by user logic is increased. In this ASIC design method, the wiring information for external terminals of the large-scale hardware macro are extracted from a net list, which is the circuit information for the semiconductor integrated circuit and, based on this wiring information for external terminals of the large-scale hardware macro, terminals for which the output is in the open state and the input is clamped are searched, the resulting information being use as so as to perform circuit tracing with respect to the macro library of the large-scale hardware macro. A redundancy removal sequence, by which interconnection data of the primitive macros that are redundant as seen from the net list and interconnection data between the redundant primitive macros are deleted, so as to generate a modified macro library, is added to the design flow, and in doing so, the redundancy removal sequence adjusts the change in delay time within the modified macro library caused by the deletion of interconnection data of primitive macro and interconnection data between primitive macros that will be redundant circuits. Another feature of the present invention is that, in order to not influence delay times of the circuits other than redundant circuits, the removal of the interconnection data for the clock lines of a flip-flop circuits is prohibited, the removal of interconnection data for circuits at which there is a branch in a combinatorial circuit is prohibited, and a limitation is imparted on the removal of interconnection data of primitive macros of a redundant circuits and interconnection data between redundant primitive macros by adding removal prohibition information within a macro library. Processing after layout and wiring is executed using the modified macro library instead of the macro library. Embodiments of the present invention are described in further detail below.

Figure 1:
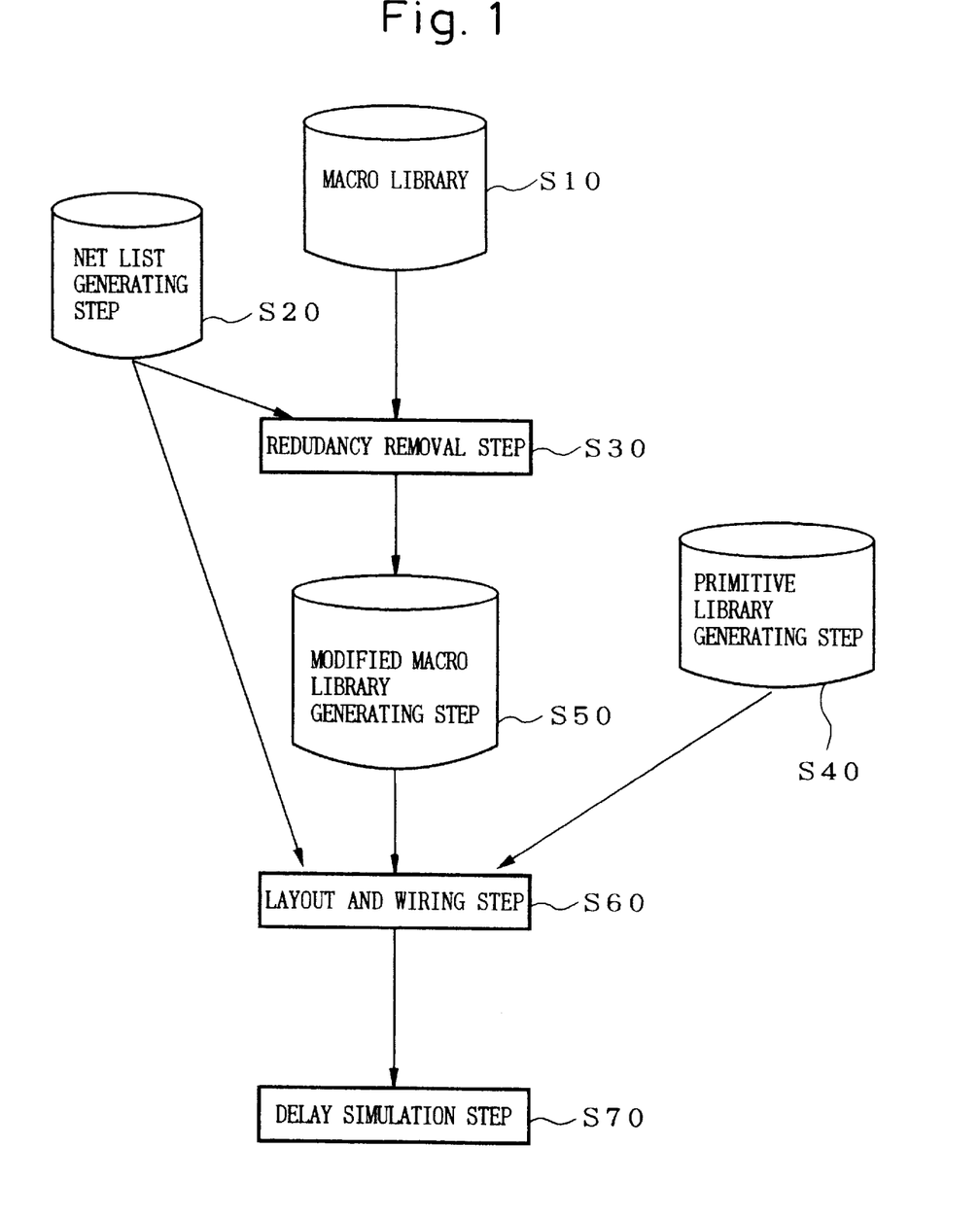
FIG. 1 is a drawing showing the flow chart, illustrating an ASIC design method according to the present invention.

FIG. 1 shows the flowchart, illustrating an ASIC design method according to the first embodiment of the present invention. Referring to FIG. 1, this embodiment has a step S10 of generating a macro library, a step S20 of generating a net list, a step S30 of removing redundant circuits, a step S40 of generating a primitive library, a step S50 of generating a modified macro library, a step S60 of performing layout and wiring or placement routing, and a step S70 of performing a delay simulation. In this embodiment, as shown in FIG. 1, first a macro library that includes a net list 20, which includes the circuit information of the semiconductor integrated circuit, and the circuit information, interconnection information, and delay information of the large-scale hardware macro 14 (described later, refer to FIG. 3), is input to the redundancy removal step S30, and a modified macro library 50 is generated. Using this modified macro library 50, the net list 20, and the primitive library 40, the layout and wiring step S60 and delay simulation step S70 are executed. The redundancy removal step S30 extracts, from the net list 20 which is the circuit information for the semiconductor integrated circuit that was input, wiring information of external terminals of the large-scale hardware macro 14, this extracted information being used for determining terminal information with regard to which outputs are open and which inputs are clamped. Based on this terminal information, forward tracing from input terminals and back tracing from output terminals are performed with respect to circuit information of the large-scale hardware macro 14 included in the macro library 10, and a modified macro library 50, from which primitive macros and interconnection data between primitive macros that will be redundant circuits as seen from the net list 20 have been removed, is generated.

Figure 2:
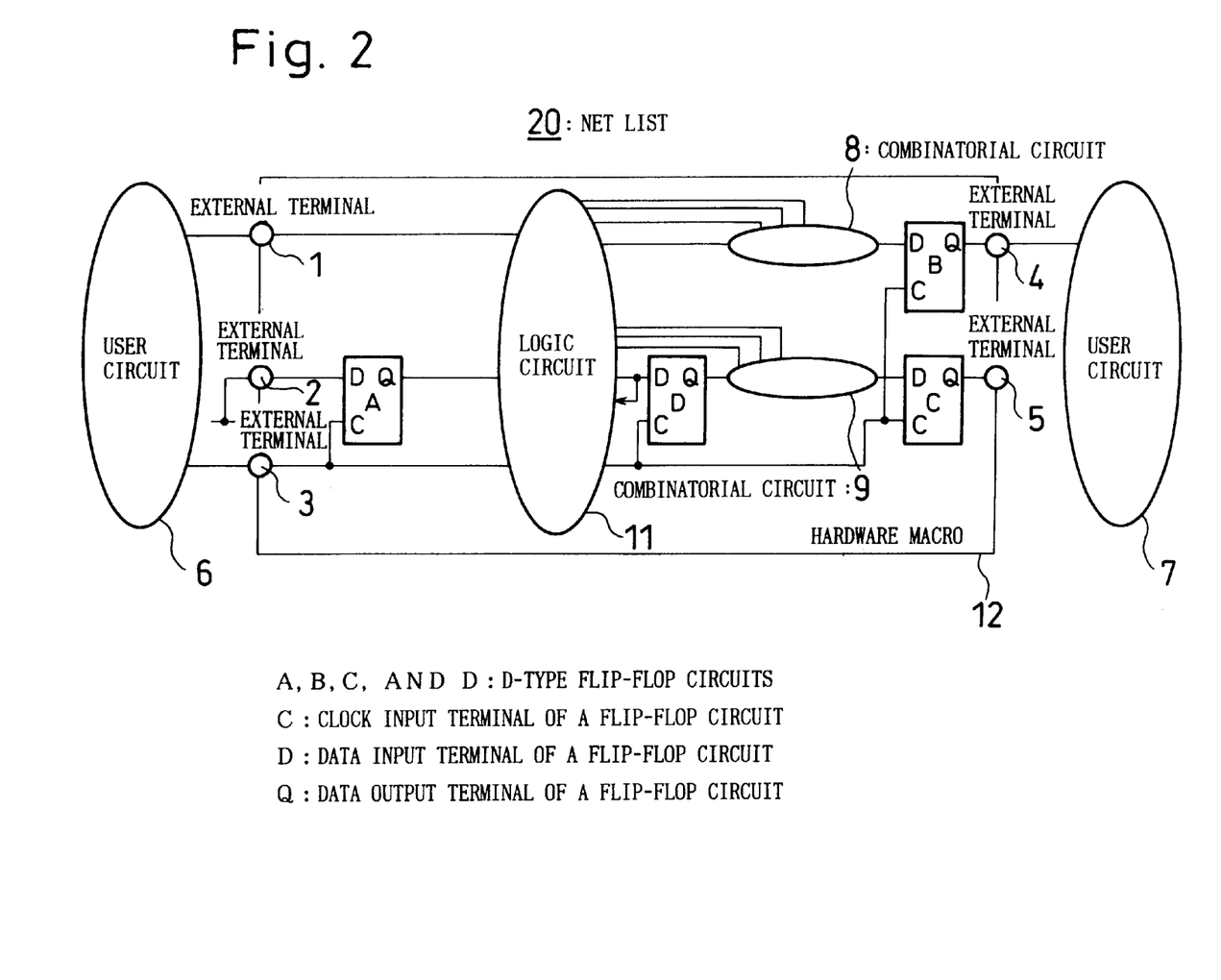
FIG. 2 is a drawing showing a basic net list of an example of a hardware macro.

FIG. 2 shows a net list 20 of a hardware macro 12. In the hardware macro 12 shown in FIG. 2, the external terminals 1 and 3 are connected to the user circuit 6, the external terminal 2 is connected to the ground, the external terminal 4 is connected to the user circuit 7, and the external terminal 5 is open. The logic circuit 11 is connected to the external terminals 1 and 3, the combinatorial circuits 8 and 9, and the D-type flip-flops A, B, C, and D. The data input terminal (D) of the D-type flip-flop A is connected to the external terminal 2, its clock terminal (c) is connected to the logic circuit 11 and the external terminal 3, and its data output terminal (Q) is connected to the logic circuit 11. The data input terminal (D) of the D-type flip-flop B is connected to the combinatorial circuit 8, its clock terminal (c) is connected to the logic circuit 11 and the clock terminal (c) of the D-type flip-flop C and D, and its data output terminal (Q) is connected to the external terminal 4. The data input terminal (D) of the D-type flip-flop C is connected to the combinatorial circuit 9, its clock terminal (c) is connected to the logic circuit 11 and the clock terminal (c) of the D-type flip-flop B and D, and its data output terminal (Q) is connected to the external terminal 5. The data input terminal (D) of the D-type flip-flop D is connected to the logic circuit 11, its clock terminal (c) is connected to the clock terminal (c) of the D-type flip-flop B and C, and its data output terminal (Q) is connected to the combinatorial circuit 9.

Figure 3:
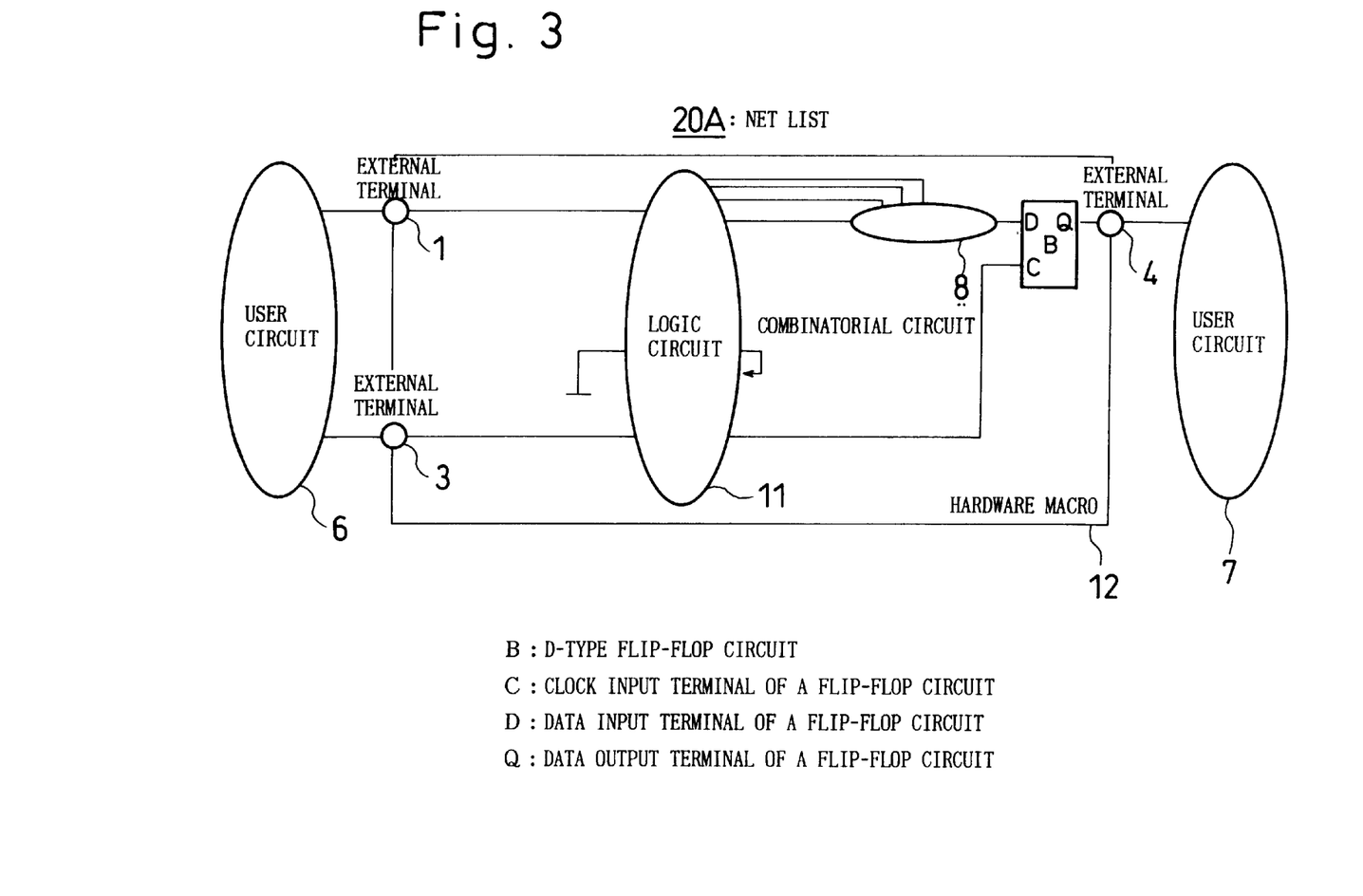
FIG. 3 is a drawing showing a net list that does not include a redundant circuit in a modified macro library according to the first embodiment.

FIG. 3 shows a net list 20A that includes a modified macro library according to the first embodiment. In this embodiment, the clamped input terminals (for example, the external terminal 2 in FIG. 2) and the open output terminals (for example, the external terminal 5 in FIG. 2) in the hardware macro 12 are searched at the redundancy removal step S30. Based on this searched information, forward tracing from the input terminals and back tracing from the output terminals are performed. As a result, it is learned that the output Q of the D-type flip-flop A is clamped to the logic L potential, and that the D-type flip-flops C, D and the combinatorial circuit 9 are redundant circuits. Based on this, the redundancy removal step S30 outputs a modified macro library 12 having circuit information such as shown in FIG. 3. In this embodiment, all circuit information for primitive macros that will be redundant circuits are removed, thereby affecting the delay time of the remaining clock lines. For this reason, the redundancy removal step S30 adjusts the change in delay time within the modified macro library that is caused by the deletion of interconnection data of primitive macro and interconnection data between redundant primitive macros.

Figure 4:
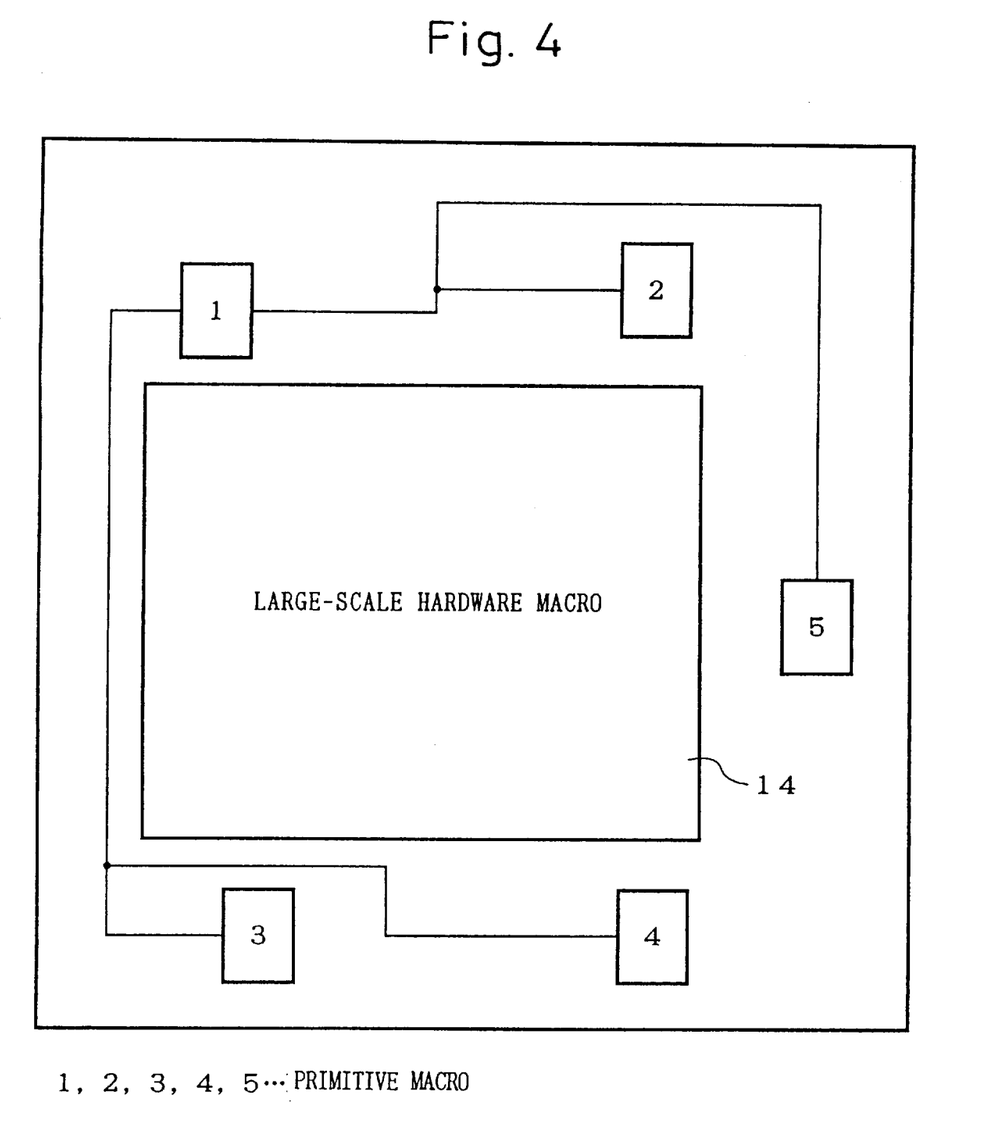
FIG. 4 is a drawing showing a first interconnection example.
Figure 5:
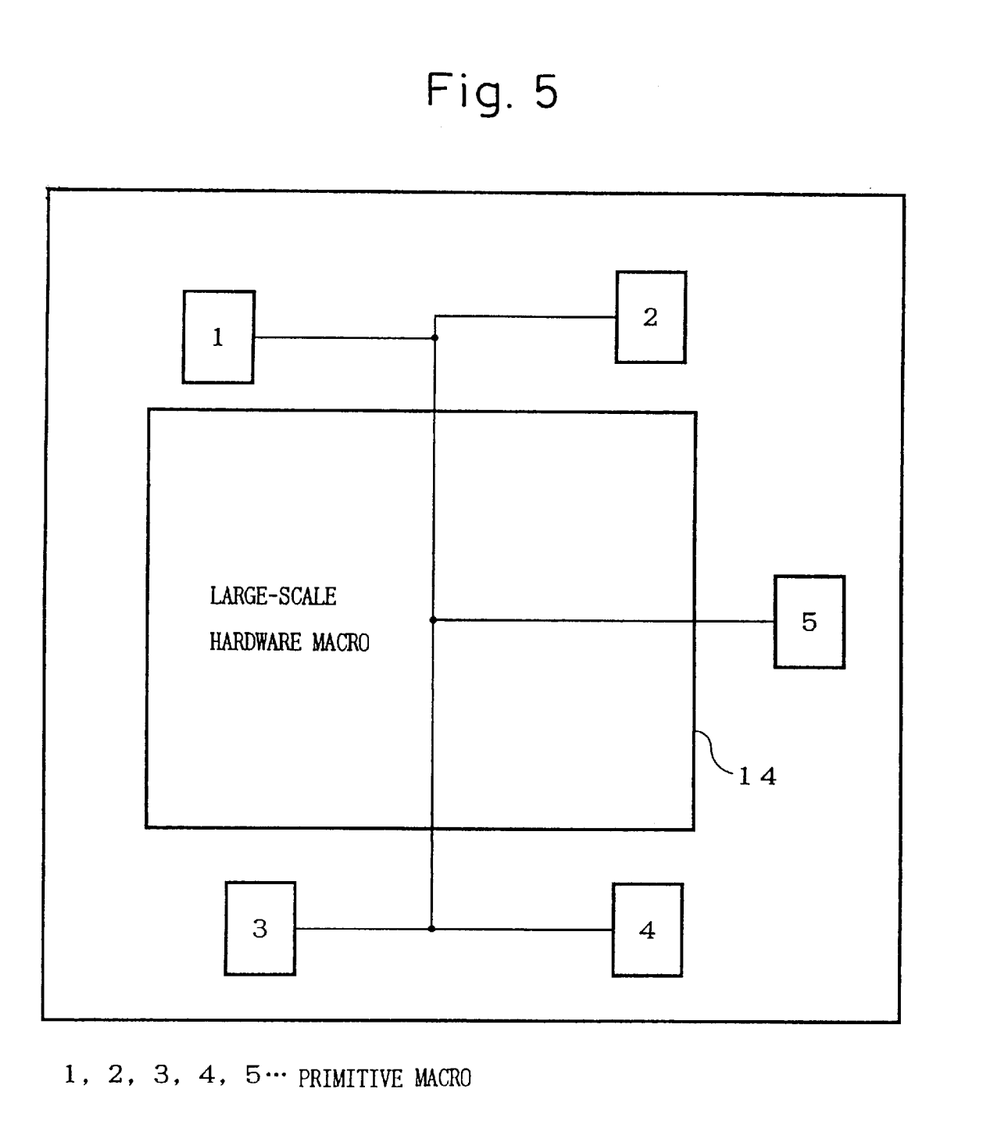
FIG. 5 is a drawing showing a second interconnection example.

The effect of this embodiment of the present invention is as follows. In an ASIC designed by a customer, some user logic circuits designed by the customer and a large-scale hardware macro 14 provided by the vendor are usually implemented on a single chip. In this case, the proportion of the area on the chip occupied by the large-scale hardware macro 14 is relatively large, and the fixed shape thereof often imposes significant influence on the layout and wiring of the user logic circuits. For example, FIG. 4 is a first example of the layout on the chip, FIG. 5 is a second example of the layout. In the case of the first interconnection example of FIG. 4, it is not possible to run interconnections over the large-scale hardware macro 14. As a result, the wiring between each primitive macro surrounds the large-scale hardware macro 14, making the interconnections long and wasting the interconnection grid, thereby resulting in a worsening of the overall interconnections. In a case, however, such as shown in FIG. 5, if interconnections over the large-scale hardware macro 14 are permitted, the wiring between primitive macros becomes short. This effect is more pronounced, the more interconnects that can be run over the large-scale hardware macro 14. In this embodiment, the redundancy removal step S30 extracts, from the net list 20 which is the circuit information for the semiconductor integrated circuit that was input, wiring information of external terminals of the large-scale hardware macro 14, this extracted information being used for determining terminal information with regard to which outputs are open and which inputs are clamped. Based on this terminal information, forward tracing from input terminals and back tracing from output terminals are performed with respect to circuit information of the large-scale hardware macro 14, and a modified macro library 50, from which redundant primitive macros and interconnection data between redundant primitive macros have been removed, is generated. For this reason, it is possible to free up wiring grids that was completely unusable with the interconnections of redundant circuits in the past, thereby having the effect of improving the interconnectivity of user logic circuits. In an ASIC such as a cell-based IC, correction of a single NAND gate after the completion of the chip requires designing anew from the start. With this embodiment of the present invention, however, because of the ability to use transistors that have been freed up from within the large-scale hardware macro 14, it is possible in the case of a small-scale change to accommodate this change with just the wiring process.

Figure 6:
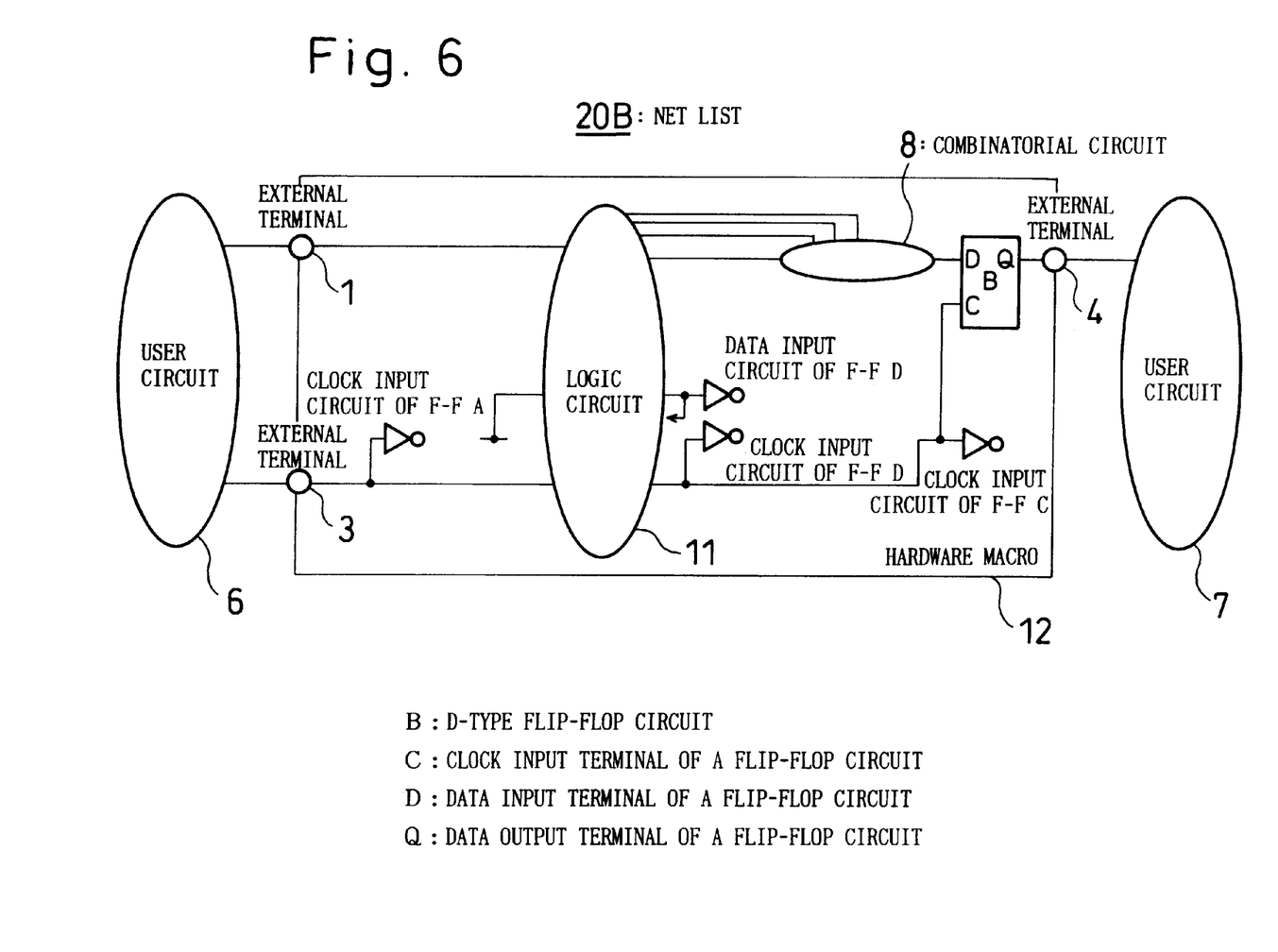
FIG. 6 is a drawing showing a net list that does not include a redundant circuit in a modified macro library according to the second embodiment.

FIG. 6 shows net list 20B that includes a modified macro library 50 according to the second embodiment of the present invention. Elements of this embodiment that are the same as corresponding elements described with regard to the first embodiment have been assigned the same reference numerals and will not be described explicitly again herein.

In the hardware macro 12 of FIG. 2, the external terminal 2 is clamped and the external terminal 5 is open. Based on this information, forward tracing from the input terminal and back tracing from the output terminal are performed. As a result, it is discovered that the data output terminal (Q) of the D-type flip-flop A is at the logic L potential, and that the D-type flip-flops C and D, and combinatorial circuit 9 are redundant circuits. In the second embodiment when performing removal of the redundant circuits, deletion of the interconnection data with regard to the clock line of the D-type flip-flop B and the deletion of the circuit that has a branch circuit in the combinatorial circuit are not done. For this reason, the redundancy removal step S30 of this embodiment outputs a modified macro library 50 having circuit information such as shown in FIG. 6. While in this second embodiment, there is some remaining primitive macro circuit information that will be redundant, because there is absolutely no effect on wiring delays, there is the effect of maintaining predetermined timing of the macro.

Figure 7:
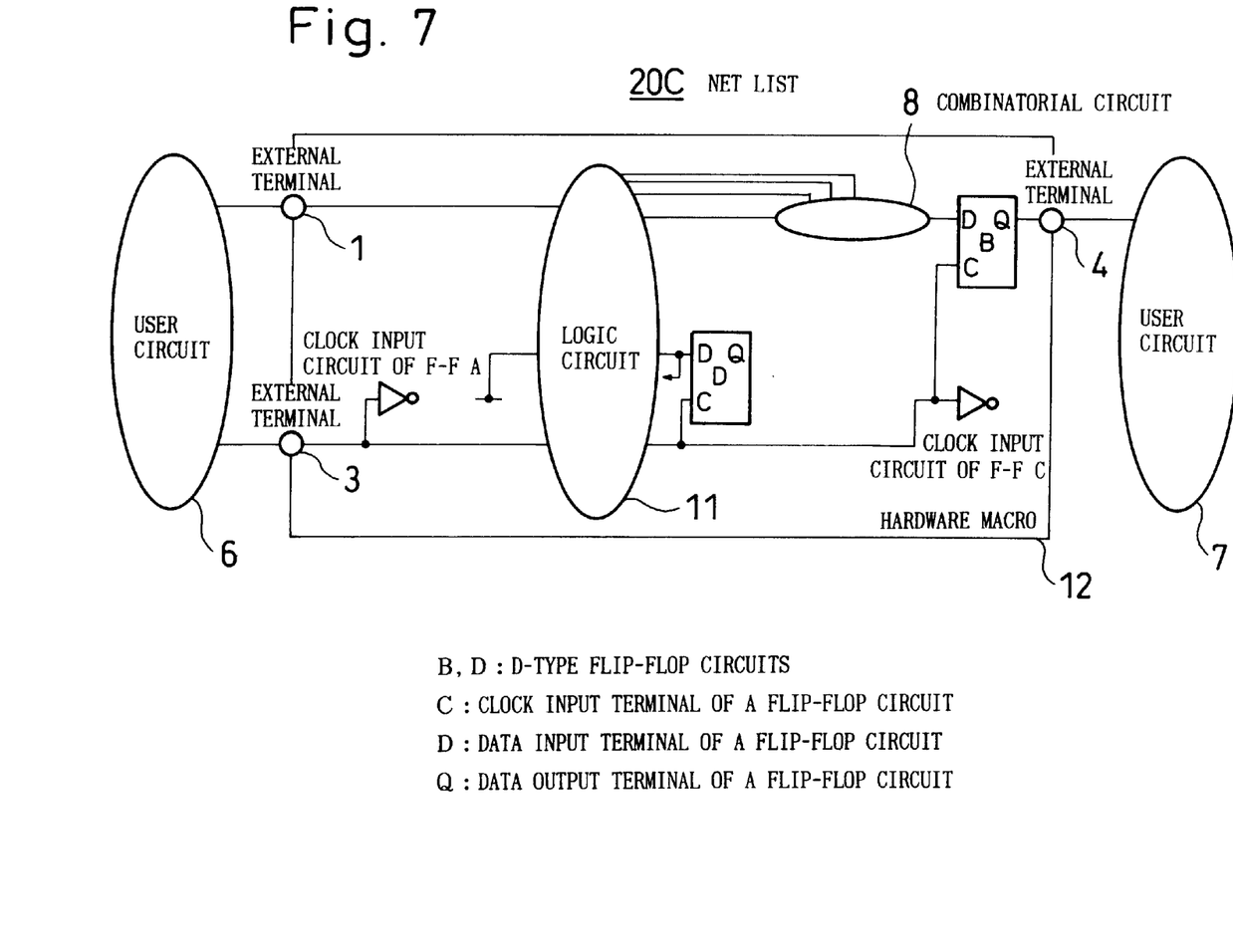
FIG. 7 is a drawing showing a net list that does not include a redundant circuit in a modified macro library according to the third embodiment.

FIG. 7 shows a net list 20C that includes a modified macro library according to the third embodiment of the present invention. Elements of this embodiment that are the same as corresponding elements described with regard to the first or second embodiment have been assigned the same reference numerals and will not be described explicitly again herein. In this embodiment, in addition to the second embodiment, prohibition information not to delete the D-type flip-flop D is added to within the macro library 10. While the D-type flip-flop D is actually a redundant circuit, in accordance with prohibition information in the macro library, the D-type flip-flop D is not deleted, so that the redundancy removal step S30 of this embodiment outputs a modified macro library having redundant circuit such as shown in FIG. 7.

While in this third embodiment, there is some remaining primitive macro circuit information that will be redundant, because there is absolutely no effect on wiring delays, there is the effect of maintaining predetermined timing of the macro.

The present invention will be understood as not being restricted to the above-noted embodiments, and it is obvious that it can take on various other embodiments. The quantities, positions, and shapes of constituent elements noted above are merely exemplary and presented as preferred quantities, positions, and shapes.

By adopting the constitution as described above, the present invention achieves the following effects. First, it enables the freeing up of wiring grids that were completely unusable because of redundant circuits, thereby improving the interconnectivity of user logic. Second, because it is possible to use transistors that have been freed up within the large-scale hardware macro, such as in a cell-based IC, as long as the change is a small-scale change, it is possible to accommodate the change with only the interconnection process.

What is claimed is:

1. A method for designing an ASIC comprising the steps of:

a first step of generating circuit data that includes a large-scale hardware macro made up of primitive macros;

a second step of extracting, from said circuit data generated in said first step, wiring data of an external terminal of said large-scale hardware macro, an output of which is in an open state or an input of which is clamped;

a third step of performing circuit tracing using said wiring data of said external terminal extracted in said second step;

a fourth step of removing wiring data of a redundant primitive macro and redundant wiring data connected to said redundant primitive macros using said wiring data of said external terminal extracted in said second step, wherein said fourth step including a step of setting removal prohibition information within said library, so as to impart a limitation on a removal of wiring data of a redundant primitive macro and redundant wiring data connected to said redundant primitive macros;

a fifth step of generating a temporary library in which a delay time within said macro is adjusted, based on removal results obtained in said fourth step; and a sixth step of performing layout and wiring, and of performing a delay simulation, using said temporary library generated in said fifth step.

2. A method for designing an ASIC according to claim 1, wherein said fourth step including a step of prohibiting a removal of wiring data of a clock line in a flip-flop circuit.

3. A method of designing an ASIC according to claim 1, wherein said fourth step including a step of prohibiting a removal of wiring data having a branch circuit in a net list, when said wiring data of said external terminal extracted in said second step includes said branch circuit.

4. An apparatus for designing an ASIC comprising:

a first means of generating circuit data that includes a large-scale hardware macro made up of a primitive macros;

a second means of extracting, from said circuit data generated in said first means, wiring data of an external terminal of said large-scale hardware macro, an output of which is in an open state or an input of which is clamped;

a third means of performing circuit tracing using said wiring data of said external terminal extracted in said second means;

a fourth means of removing wiring data of a redundant primitive macro and redundant wiring data connected to said redundant primitive macros using said wiring data of said external terminal extracted in said second means, wherein said fourth means including a means of setting removal prohibition information within said library, so as to impart a limitation on a removal of wiring data of a redundant primitive macro and redundant wiring data connected to said redundant primitive macro;

a fifth means of generating a temporary library in which a delay time within said macro is adjusted, based on an output of said fourth means; and a sixth means of performing layout and wiring, and of performing a delay simulation, using said temporary library generated in said fifth means.

5. An apparatus for designing an ASIC according to claim 4, wherein said fourth means including a means of prohibiting a removal of wiring data of a clock line in a flip-flop circuit.

6. An apparatus for designing an ASIC according to claim 4, wherein said fourth means including a means of prohibiting a removal of wiring data having a branch circuit in a net list, when said wiring data of said external terminal extracted in said second means includes said branch circuit.

* * * * *